(12) United States Patent  (10) Patent No.: US 11,901,484 B2
Yang et al.  (45) Date of Patent: Feb. 13, 2024

(54) METHODS AND SYSTEMS FOR UV LED STRUCTURES

(71) Applicant: Applied Materials, Inc., Santa Clara, CA (US)

(72) Inventors: Zihao Yang, Cupertino, CA (US); Mengnan Zou, Santa Clara, CA (US); Mingwei Zhu, San Jose, CA (US); David Masayuki Ishikawa, Mountain View, CA (US); Nag Patibandla, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 17/345,992

(22) Filed: Jun. 11, 2021

(65) Prior Publication Data

US 2022/0399474 A1  Dec. 15, 2022

(51) Int. Cl.
*H01L 33/00* (2010.01)
*H01L 33/02* (2010.01)
*H01L 33/06* (2010.01)
*H01L 33/12* (2010.01)
(Continued)

(52) U.S. Cl.
CPC ............ *H01L 33/12* (2013.01); *H01L 33/007* (2013.01); *H01L 33/0025* (2013.01); *H01L 33/0062* (2013.01); *H01L 33/0066* (2013.01); *H01L 33/0095* (2013.01); *H01L 33/06* (2013.01); *H01L 33/145* (2013.01); *H01L 33/32* (2013.01)

(58) Field of Classification Search
CPC ......... H01L 33/12; H01L 33/00; H01L 33/06; H01L 33/32; H01L 33/145; H01L 33/00025; H01L 33/0062; H01L 33/007; H01L 33/0095
See application file for complete search history.

(56) References Cited

U.S. PATENT DOCUMENTS

| 4,830,987 A | * | 5/1989 | Miller ................. H01L 21/3185 257/E21.326 |
| 5,614,447 A | * | 3/1997 | Yamaga ................. C30B 29/42 438/795 |
| 6,329,215 B1 | | 12/2001 | Porowski et al. |

(Continued)

FOREIGN PATENT DOCUMENTS

| CN | 111785815 A | 10/2020 |
| CN | 112670383 A | 4/2021 |

(Continued)

OTHER PUBLICATIONS

International Search Report and Written Opinion dated Sep. 21, 2022 in International Patent Application No. PCT/US2022/031138, 11 pages.

*Primary Examiner* — Savitri Mulpuri
(74) *Attorney, Agent, or Firm* — Kilpatrick Townsend & Stockton LLP (57) ABSTRACT

Exemplary processing methods of forming an LED structure may include depositing an aluminum nitride layer on a substrate via a physical vapor deposition process. The methods may include heating the aluminum nitride layer to a temperature greater than or about 1500° C. The methods may include forming an ultraviolet light emitting diode structure overlying the aluminum nitride layer utilizing a metal-organic chemical vapor deposition or molecular beam epitaxy.

17 Claims, 5 Drawing Sheets

(51) Int. Cl.
*H01L 33/32* (2010.01)
*H01L 33/14* (2010.01)

(56) References Cited

U.S. PATENT DOCUMENTS

| | | | |
|---|---|---|---|
| 2014/0264363 A1* | 9/2014 | Zhu | H01L 31/1856 438/93 |
| 2018/0274088 A1* | 9/2018 | Miyake | H01L 21/02389 |
| 2019/0355571 A1* | 11/2019 | Yoshikawa | H01L 33/16 |

FOREIGN PATENT DOCUMENTS

| | | |
|---|---|---|
| CN | 112736174 A | 4/2021 |
| TW | 201718921 A | 6/2017 |

\* cited by examiner

METHODS AND SYSTEMS FOR UV LED STRUCTURES

TECHNICAL FIELD

The present technology relates to semiconductor processing and materials. More specifically, the present technology relates to formation processes and materials for LED components.

BACKGROUND

LED panels or devices may be formed with a number of light sources that operate as pixels on the device. The pixels may be formed with monochromatic light sources that are then delivered through a conversion layer to produce color, or the pixels may each have individual red, blue, and green light sources formed. In either scenario, any number up to millions of light sources may be formed and connected for operation. While visible LEDs are well developed, LEDs that operate within the ultraviolet spectrum suffer from much reduced performance.

Thus, there is a need for improved systems and methods that can be used to produce high quality devices and structures. These and other needs are addressed by the present technology.

SUMMARY

Exemplary processing methods of forming an LED structure may include depositing an aluminum nitride layer on a substrate via a physical vapor deposition process. The methods may include heating the aluminum nitride layer to a temperature greater than or about 1500° C. The methods may include forming an ultraviolet light emitting diode structure overlying the aluminum nitride layer utilizing a metal-organic chemical vapor deposition or molecular beam epitaxy.

In some embodiments, the methods may include transferring the substrate to a carrier subsequent to depositing the aluminum nitride layer. The carrier may be or include carbon, and the carrier may define a ledge on which the substrate may be seated. A first cover wafer may be disposed overlying the substrate on the carrier. A second cover wafer may be disposed underlying the substrate on the carrier. Each of the first cover wafer and the second cover wafer may be a substrate having an aluminum nitride layer. The first cover wafer and the second cover wafer may be oriented in a similar direction as the substrate. The substrate may be disposed face down on the carrier. At least two substrates may be disposed in direct contact between the first cover wafer and the second cover wafer on the carrier. The aluminum nitride layer may be heated to a temperature between about 1600° C. and about 1800° C. The aluminum nitride layer may be heated at greater than or about 1000° C. for at least 100 minutes. A full width at half maximum of an x-ray diffraction rocking curve of the aluminum nitride layer along the (102) crystal direction may be less than or about 300 arc-seconds. The substrate may maintain greater than or about 85% coverage of the aluminum nitride layer subsequent to heating the aluminum nitride layer.

Some embodiments of the present technology may encompass methods of forming an LED structure. The methods may include depositing an aluminum nitride layer on a first substrate and a second substrate via a physical vapor deposition process. The methods may include positioning the first substrate face down in a carrier. The methods may include positioning the second substrate face down in contact with the first substrate. The methods may include heating the first substrate and the second substrate to a temperature greater than or about 1500° C.

In some embodiments, the methods may include forming an ultraviolet light emitting diode structure overlying the aluminum nitride layer utilizing a metal-organic chemical vapor deposition or molecular beam epitaxy. The aluminum nitride layer may be heated to a temperature between about 1600° C. and about 1800° C. The carrier may be or include carbon, and the carrier may define a ledge on which both the first substrate and the second substrate are seated. Positioning the first substrate face down in the carrier may include positioning the first substrate on a first cover wafer. The methods may include positioning a second cover wafer overlying the second substrate on the carrier. Each of the first cover wafer and the second cover wafer may be a substrate having an aluminum nitride layer. Each of the first cover wafer, the second cover wafer, the first substrate, and the second substrate may be oriented in a similar direction.

Some embodiments of the present technology may encompass methods of forming an LED structure. The methods may include depositing an aluminum nitride layer on a substrate via a physical vapor deposition process. The methods may include positioning the substrate face down overlying a first cover wafer positioned in a carrier. The methods may include positioning a second cover wafer overlying the substrate. The methods may include heating the aluminum nitride layer to a temperature greater than or about 1500° C. The methods may include forming an ultraviolet light emitting diode ("LED") structure overlying the aluminum nitride layer utilizing a metal-organic chemical vapor deposition or molecular beam epitaxy. In some embodiments, a full width at half maximum of an x-ray diffraction rocking curve of the aluminum nitride layer along the (102) crystal direction may be less than or about 300 arc-seconds.

Such technology may provide numerous benefits over conventional systems and techniques. For example, the present technology may provide a method for forming a high-quality buffer layer characterized by reduced threading dislocations. Additionally, the present technology may utilize carriers and positioning arrangements to produce ultraviolet light-emitting diodes that are characterized by increased performance over conventional devices. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Deep ultraviolet light refers to light produced within the wavelengths of about 280 nm and about 200 nm, and which has conventionally been produced with mercury gas discharge lamps. However, as more environmentally friendly methods of producing UV light have proliferated, conventional technologies have been incapable of accommodating these wavelengths at sufficient operational efficiency. Many conventional UV light-emitting diodes ("LED") are formed on physically-deposited aluminum nitride buffers over sapphire substrates. While this type of substrate may operate effectively for standard blue LED configurations, UV LEDs may not operate effectively. For example, blue LEDs may be characterized by a quantum efficiency of greater than or about 50%, and thus a relatively low quality LED structure may still produce sufficient light. UV LEDs, however, may be characterized by much lower quantum efficiency, such as less than or about 10%, less than or about 5%, or less, due to several structural and material issues. For example, lower crystal quality materials may be a limiting factor that may critically reduce UV LED performance.

As noted above, many gallium nitride based structures used in LEDs may include a substrate that may be silicon or sapphire. To improve operation of the device, the present technology may form a buffer layer overlying the substrate prior to forming an LED structure by metal-organic chemical-vapor deposition or molecular beam epitaxy. However, the buffer layer, which may be a dielectric material, such as aluminum nitride as one non-limiting example, may be characterized by a different crystalline structure compared to sapphire. This may cause lattice mismatch between the materials, which may cause a relaxation of the buffer layer structure, and which may lead to threading dislocations in the buffer layer. These dislocations may carry through the subsequent device layers formed, including the LED active region, which may further reduce the quantum efficiency of the device.

The present technology may overcome these issues by performing a high-temperature anneal of the buffer layer subsequent to formation. The anneal process may facilitate rearrangement and improvement of the buffer layer crystal structure, which may reduce or eliminate threading dislocations in the buffer layer. This may improve the quality of the subsequently formed LED structure, which may facilitate improving quantum efficiency of the device. Although the remaining disclosure will routinely identify specific LED materials and processes utilizing the disclosed technology, it will be readily understood that the systems and methods are equally applicable to a variety of materials and processes as may occur for producing displays. Accordingly, the technology should not be considered to be so limited as for use with UV processes alone. After discussing an exemplary chamber system that may be used according to some embodiments of the present technology, methods and components for producing high-quality devices will be described.

Figure 1:
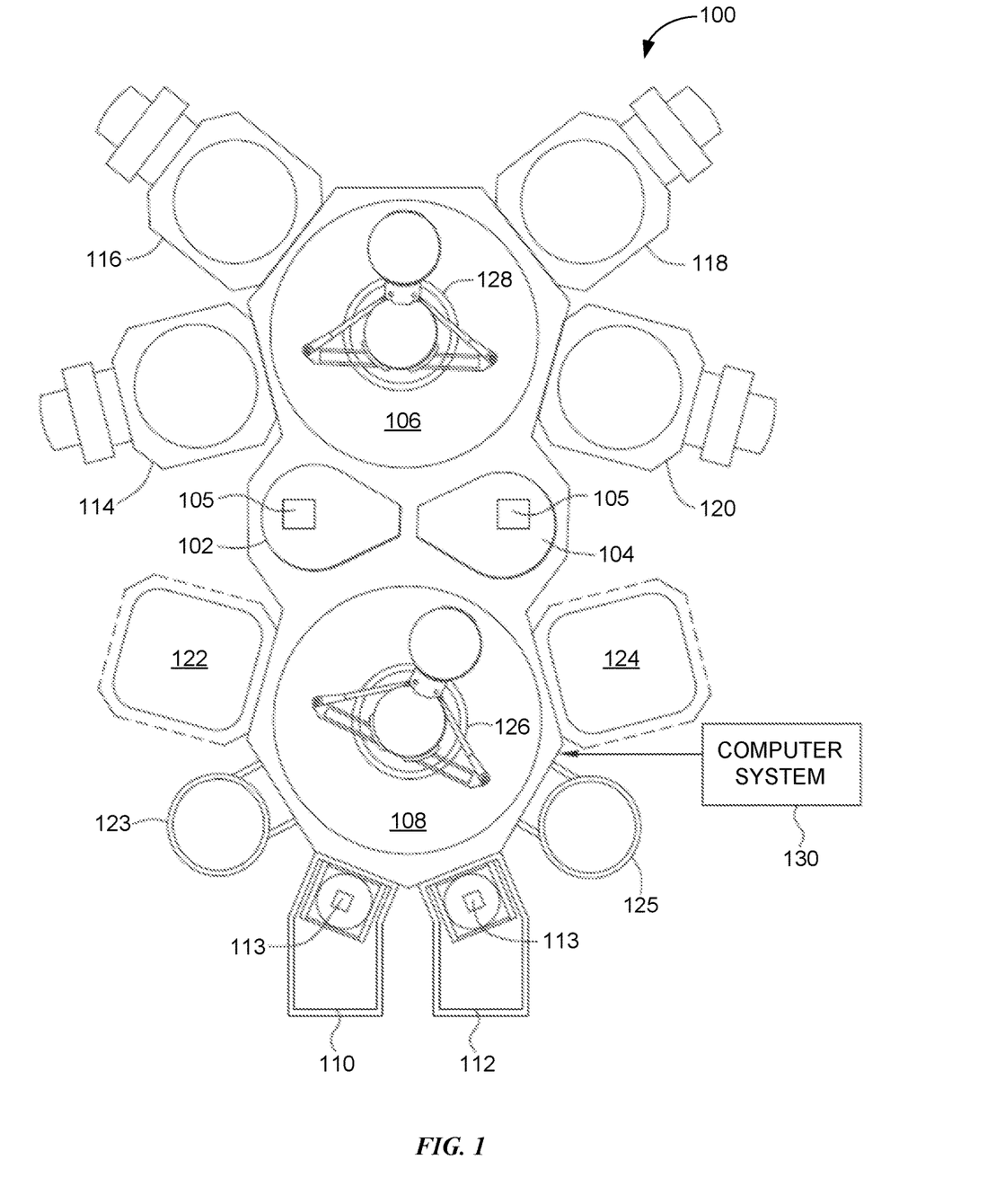
FIG. 1 shows a top plan view of one embodiment of an exemplary processing system according to some embodiments of the present technology.

FIG. 1 illustrates a top plan view of a multi-chamber processing system 100, which may be specifically configured to implement aspects or operations according to some embodiments of the present technology. The multi-chamber processing system 100 may be configured to perform one or more fabrication processes on individual substrates, such as any number of semiconductor substrates, for forming semiconductor devices. The multi-chamber processing system 100 may include some or all of a transfer chamber 106, a buffer chamber 108, single wafer load locks 110 and 112, although dual load locks may also be included, processing chambers 114, 116, 118, 120, 122, and 124, preheating chambers 123 and 125, and robots 126 and 128. The single wafer load locks 110 and 112 may include heating elements 113 and may be attached to the buffer chamber 108. The processing chambers 114, 116, 118, and 120 may be attached to the transfer chamber 106. The processing chambers 122 and 124 may be attached to the buffer chamber 108. Two substrate transfer platforms 102 and 104 may be disposed between transfer chamber 106 and buffer chamber 108, and may facilitate transfer between robots 126 and 128. The platforms 102, 104 can be open to the transfer chamber and buffer chamber, or the platforms may be selectively isolated or sealed from the chamber to allow different operational pressures to be maintained between the transfer chamber 106 and the buffer chamber 108. Transfer platforms 102 and 104 may each include one or more tools 105, such as for orientation or measurement operations.

The operation of the multi-chamber processing system 100 may be controlled by a computer system 130. The computer system 130 may include any device or combination of devices configured to implement the operations described below. Accordingly, the computer system 130 may be a controller or array of controllers and/or a general purpose computer configured with software stored on a non-transitory, computer-readable medium that, when executed, may perform the operations described in relation to methods according to embodiments of the present technology. Each of the processing chambers 114, 116, 118, 120, 122, and 124 may be configured to perform one or more process steps in the fabrication of a semiconductor structure. More specifically, the processing chambers 114, 116, 118, 120, 122, and 124 may be outfitted to perform a number of substrate processing operations including dry etch processes, cyclical layer deposition, atomic layer deposition, chemical vapor deposition, physical vapor deposition, etch, pre-clean, degas, orientation, among any number of other substrate processes.

Figure 2:
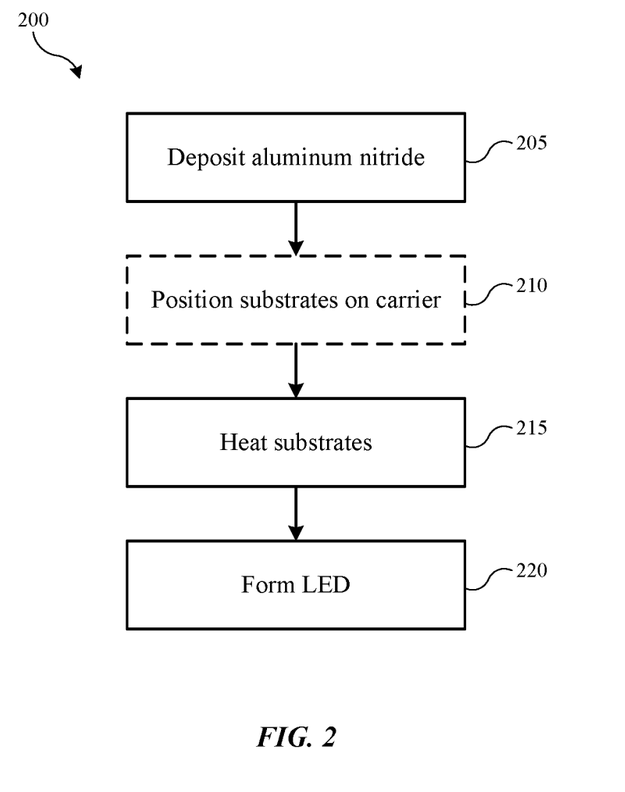
FIG. 2 shows selected operations in a method of forming a light-emitting diode structure according to some embodiments of the present technology.

Turning to FIG. 2 is illustrated selected operations of a fabrication method 200 for forming an LED structure. Method 200 may include one or more operations prior to the initiation of the method, including front end processing, deposition, etching, polishing, cleaning, or any other operations that may be performed prior to the described operations. For example, in some embodiments a degas operation may be performed on a substrate, such as silicon or sapphire substrate, to prepare the substrate for deposition. The method may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below. Method 200 describes operations shown schematically in FIG. 3, the illustration of which will be described in conjunction with the operations of method 200. It is to be understood that FIG. 3 illustrates only a partial schematic view, and a substrate may contain any number of LED sections having aspects as illustrated in the figure, as well as alternative structural aspects that may still benefit from aspects of the present technology.

Method 200 may involve optional operations to develop the structure to a particular fabrication operation. As illustrated in FIG. 3, an LED source substrate 305 may be used to facilitate a plurality of LEDs being formed or grown overlying the substrate. Although only 1 LED structure is illustrated, it is to be understood that a substrate may have hundreds, thousands, millions, or more LEDs formed, and which may be any size, as the present technology may encompass microLEDs among any other types of LED structure. Substrate 305 may be any substrate on which structures may be formed, such as silicon-containing materials, aluminum materials, including sapphire, or any other materials as may be used in display or semiconductor fabrication. The substrate may be any size, including two inches, three inches, four inches, six inches, or greater than a substrate size in embodiments of the present technology. The substrate may be cleaned or processed in preparation for depositing one or more layers of material on the substrate for producing an LED, for example, although any number of other semiconductor structures may similarly benefit from aspects of the present technology. The present technology may be applied to produce any type of LED structure, and in some embodiments the structure may be a blue LED, such as a deep UV LED.

Figure 3A:
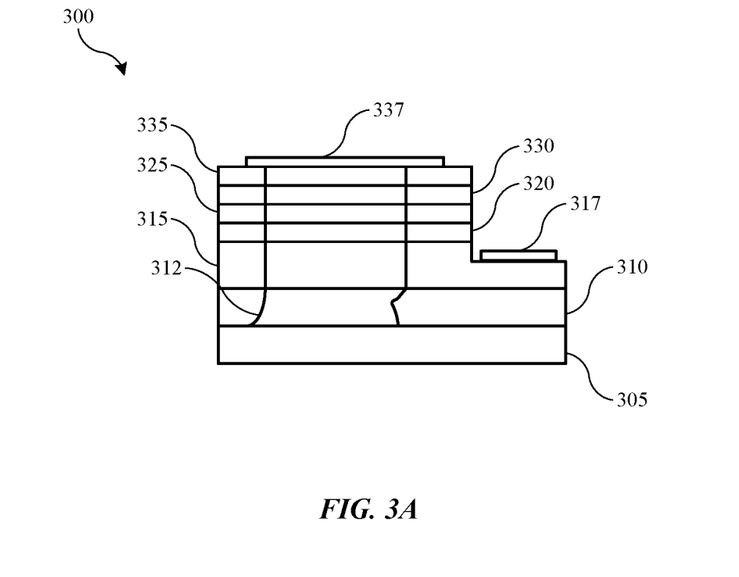
FIG. 3A illustrates a schematic view of a device developed according to some embodiments of the present technology.

Method 200 may include forming or depositing a buffer layer of material overlying the substrate, such as buffer layer 310 as illustrated in FIG. 3. The buffer layer may be formed of a material that may facilitate formation of a structure overlying the buffer layer, and produced by metal-organic chemical-vapor deposition or molecular beam epitaxy, for example. By including a buffer layer between the substrate and the LED structure, improved device performance may be produced. The buffer layer may be any number of materials, and in some embodiments may be aluminum nitride. Although the buffer layer may be formed by any number of processes for deposition or formation, in some embodiments the aluminum nitride buffer layer may be formed via a physical vapor deposition process. By forming a buffer layer by physical vapor deposition, the thermal budget of the LED fabrication may be reduced, which may improve crystal orientation and morphology between layers, and which may enable faster deposition compared to conventional technologies, as well as reduced formation of threading dislocations.

As explained above, the aluminum nitride layer may be characterized by a different crystal structure from the underlying substrate, such as sapphire. Accordingly, because of this lattice mismatch, the aluminum nitride layer may be formed under stress. As the structure relaxes subsequent to its formation, the structure may adjust, which may cause threading dislocations to form in the layer, such as dislocations 312 illustrated in FIG. 3. During formation, numerous dislocations may be formed across the buffer layer, which if untreated may extend through the subsequently formed LED structure. Accordingly, the present technology may include additional operations to treat or rearrange the buffer layer structure to limit or reduce the number of dislocations remaining. By lowering the number of threading dislocations, the LED structure quality may be improved, which may increase the quantum efficiency of the LED structure formed.

To improve the crystal quality of the buffer layer, and to reduce the number of threading dislocations, the present technology may perform an anneal process on the buffer layer. Although the anneal may be performed in any of the processing chambers on the system, such as system 100, in some embodiments the anneal operation may be performed in a separate chamber. For example, the substrate including the buffer layer, such as of aluminum nitride, may be transferred to a carrier subsequent to depositing the aluminum nitride layer at optional operation 210. The carrier may then be positioned in a furnace chamber or other chamber that may heat the substrate. Method 200 may then include heating the substrate, or the buffer layer, to a temperature sufficient to improve the crystal quality, and remove threading dislocations at operation 215. Subsequent to the heating operation, an LED structure may be formed overlying the realigned buffer layer at operation 220, and which may include formation of an UV LED structure. The LED structure may be formed by a metal-organic chemical-vapor deposition process or molecular beam epitaxy, as well as any other formation technique, which may produce any number of LED structures, such as the structure illustrated in FIG. 3. For example, overlying the buffer layer 310 may be formed a structure including any number of materials and/or layers. As one non-limiting example, the structure may include an n-doped layer 315, such as aluminum gallium nitride. A multiple quantum well layer 320 may be formed overlying the n-doped region, and an electron blocking layer 325 may be formed overlying the multiple quantum well layer. In some embodiments, both layers may also be aluminum gallium nitride, although any number of other materials may similarly be used.

A p-doped layer 330 may be formed overlying the electron blocking layer, followed by a subsequent p-doped layer 335 formed overlying layer 330. These layers may also be or include aluminum gallium nitride, gallium nitride, or any number of other materials. The structure may then be patterned, and contacts may be formed. For example, an n-metal contact may be formed overlying n-doped layer 315, and a p-metal contact may be formed overlying the p-doped layer 335. Because threading dislocations 312 may carry through the structure, by performing an anneal according to embodiments of the present technology, limited dislocations may extend through the structure, which may improve quantum efficiency. For example, by utilizing processes according to some embodiments of the present technology, the efficiency of the deep UV LED may be greater than or about 1%, greater than or about 2%, greater than or about 5% or more.

The anneal operation may be performed to reduce threading dislocations in the layer, and to facilitate reorganization of the crystal structure, the heating may be performed at a temperature sufficient to repair defects in the crystal structure. For example, with an aluminum nitride buffer layer, the substrate and/or aluminum nitride layer may be heated to greater than or about 1000° C., and may be heated to greater than or about 1100° C., greater than or about 1200° C., greater than or about 1300° C., greater than or about 1400° C., greater than or about 1500° C., greater than or about 1550° C., greater than or about 1600° C., greater than or about 1650° C., greater than or about 170° C., greater than or about 1750° C., greater than or about 1800° C., greater than or about 1850° C., or higher. Without intending to bind the present technology to any particular theory, there may be a temperature at which activation energy is sufficient to repair crystal defects and improve the crystal structure of the buffer layer. However, as temperature continues to increase, thermal roughening of the surface may occur, as well as loss of edge material. For example, the deposition process may produce a film characterized by reduced thickness at edge regions of the substrate, and which may be more sensitive to loss during the anneal process. Additionally, defects may begin to develop on the surface of the buffer layer, such as damage to the aluminum nitride, which may reduce operational efficiency. Accordingly, in some embodiments, the temperature may be maintained at less than or about 1850° C., and may be maintained at less than or about 1800° C., less than or about 1750° C., between about 1600° C. and about 1800° C., between about 1650° C. and about 1750° C., or between about 1675° C. and about 1725° C. to ensure threading dislocations may be removed, while limiting material loss and defect generation.

Figure 3B:
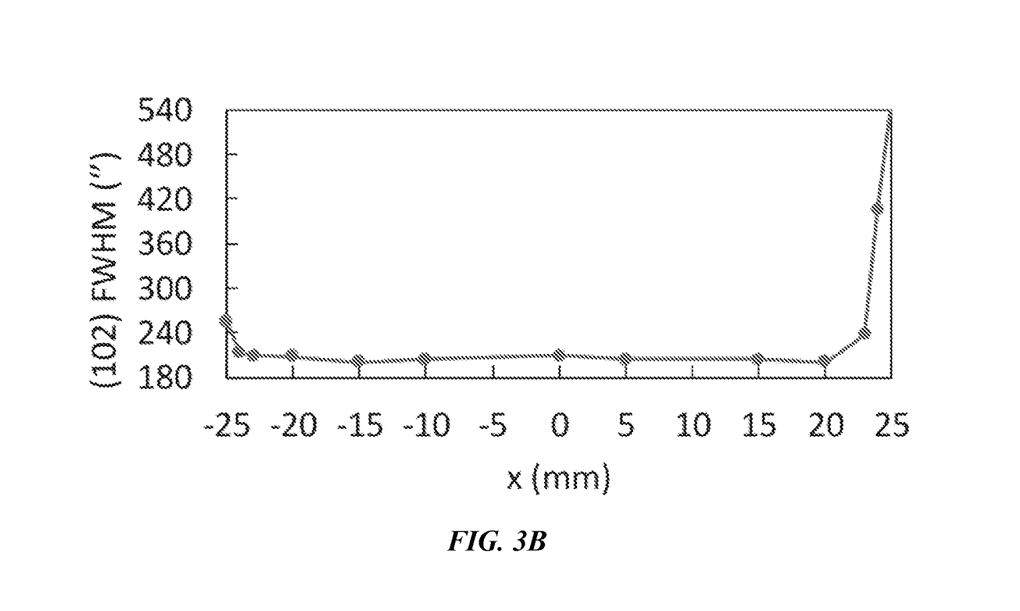
FIG. 3B shows a chart of a rocking curve scan of films produced according to some embodiments of the present technology.

The pressure within the treatment chamber may be variable, and thus in some embodiments the pressure may be maintained at slight vacuum, such as at less than or about 700 Torr, less than or about 600 Torr, less than or about 500 Torr, less than or about 400 Torr, or less. Additionally, the anneal may be performed in an inert environment, such as in a nitrogen environment, for example. To produce a more uniform treatment across the substrate, the time of treatment at any of the temperatures noted above may be maintained at greater than or about 60 minutes, and may be maintained at greater than or about 80 minutes, greater than or about 100 minutes, greater than or about 110 minutes, greater than or about 120 minutes, greater than or about 130 minutes, greater than or about 140 minutes, greater than or about 150 minutes, greater than or about 160 minutes, greater than or about 170 minutes, greater than or about 180 minutes, greater than or about 190 minutes, greater than or about 200 minutes, or longer. By performing the anneal for sufficient time, the uniformity of the crystal quality may extend further across the substrate. For example, FIG. 3B shows a rocking curve scan along the x-direction, or parallel to the wafer flat, illustrating that film quality is substantially uniform across the substrate, with a full width at half maximum measurement of less than 260 arcseconds across the wafer. However, the longer the treatment may be performed, the more loss of buffer layer material may occur across the substrate. Accordingly, to maintain the material and improve the anneal process, some embodiments of the present technology may utilize a carrier to seat the substrates during the anneal process.

Figure 4:
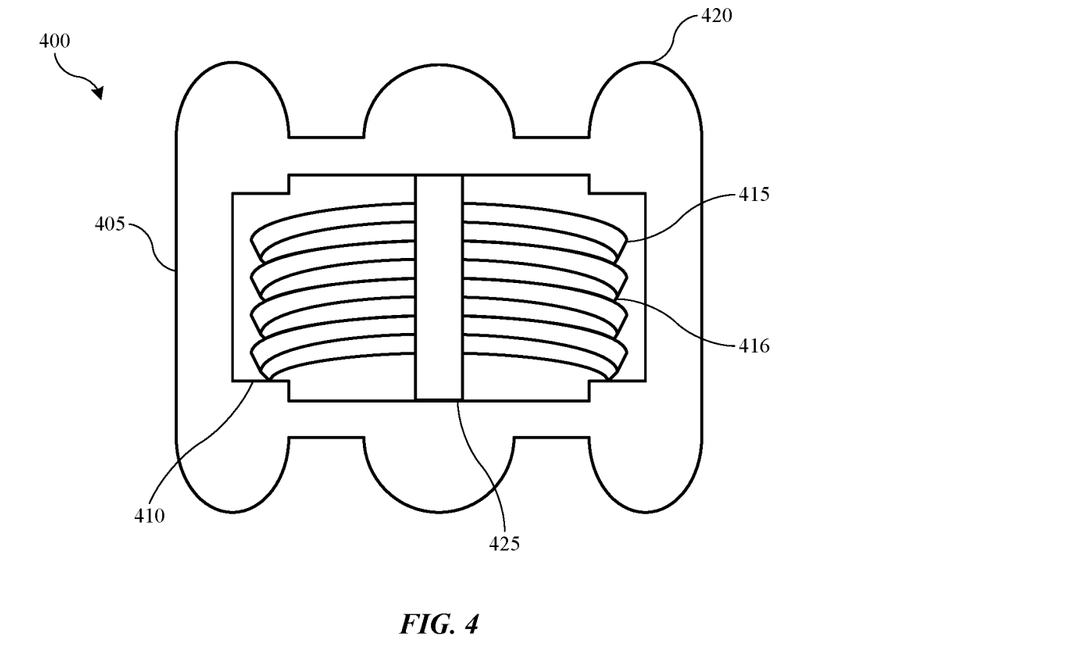
FIG. 4 illustrates a schematic view of a carrier for high-temperature processing according to some embodiments of the present technology.

FIG. 4 illustrates a schematic view of a carrier 400 for high-temperature processing according to some embodiments of the present technology, and which may be used in the anneal operations discussed with respect to method 200, for example. Carrier 400 is illustrated to show exemplary features of carriers encompassed by the present technology, and the carrier is not intended to be limited by any particular features shown. Carriers according to some embodiments of the present technology may be configured to seat one or more substrates, such as substrates on which a buffer layer has been deposited. For example, carrier 400 may include a housing 405, which may define a ledge 410 on which one or more substrates 415 may be seated. One or more substrates, including each substrate, may include a buffer layer 416 disposed on a first surface of the substrate.

Although illustrated with one ledge, and one set of substrates, carriers according to embodiments of the present technology may include a plurality of ledges that each may support one or more substrates and/or cover wafers as described below. The carrier may be a generally open design as illustrated, such as by having two, three, four, or more posts 420 defining one or more ledges along a length of the post. A removable rod or element 425 may be fitted into one of the posts, or a gap between posts, and which may be threaded or otherwise removably seated within the carrier. For example, element 425 may be accessible through the head of the carrier, and seated on a recess formed in the base of the carrier. Although components, such as springs or detent mechanisms, may be included to seat or release the post, in some embodiments the carrier may expressly not include these components due to the high temperature operations to which the carrier may be exposed. Element 425 may be removed to deposit or remove substrates from the one or more ledges of the carrier, and then the element may be replaced to secure the substrates prior to processing.

The carrier 400 may be or include one or more materials configured the withstand the environment of the furnace, as well as to limit thermal stress issues with the carrier, and between the carrier and the substrate or substrates. For example, in some embodiments carrier 400 may be or include carbon or a carbon-containing material. For example, the carrier may be or include graphite, as well as a coated graphite, such as a graphitic material coated with silicon carbide, or any other material that may withstand the high-temperature environment. In some embodiments, the substrates may be positioned to be in contact with at least one additional substrate or other component as illustrated. Additionally, the substrates may be oriented in one or more ways within the carrier. For example, although the substrates may be disposed within the carrier facing front-to-front, or back-to-back, in some embodiments the substrates may be oriented in a similar direction as at least one additional substrate, or in some embodiments as illustrated, each substrate may be oriented in the same direction. By orienting the substrates in a similar direction, buffer layer coverage may be improved, and may be improved significantly compared to other orientations.

For example, testing has shown that when substrates are positioned face-to-face, such as having the buffer layer of a first substrate face the buffer layer of a second substrate, increased loss of buffer layer material may occur, as well as loss of quality of the material. For example, face-to-face orientations may be characterized, subsequent to the anneal, by having less than or about 80% coverage across a surface of the substrate, and may be characterized by having less than or about 75% coverage, less than or about 70% coverage, less than or about 65% coverage, less than or about 60% coverage, or less, which may be due to evaporation of materials during the annealing, for example. However, when substrates are oriented face down in the same direction, such as shown, the substrates may maintain greater than or about 80% coverage across the surface of the substrate subsequent to the anneal, and may maintain greater than or about 85% coverage, greater than or about 90% coverage, or more.

Figure 5:
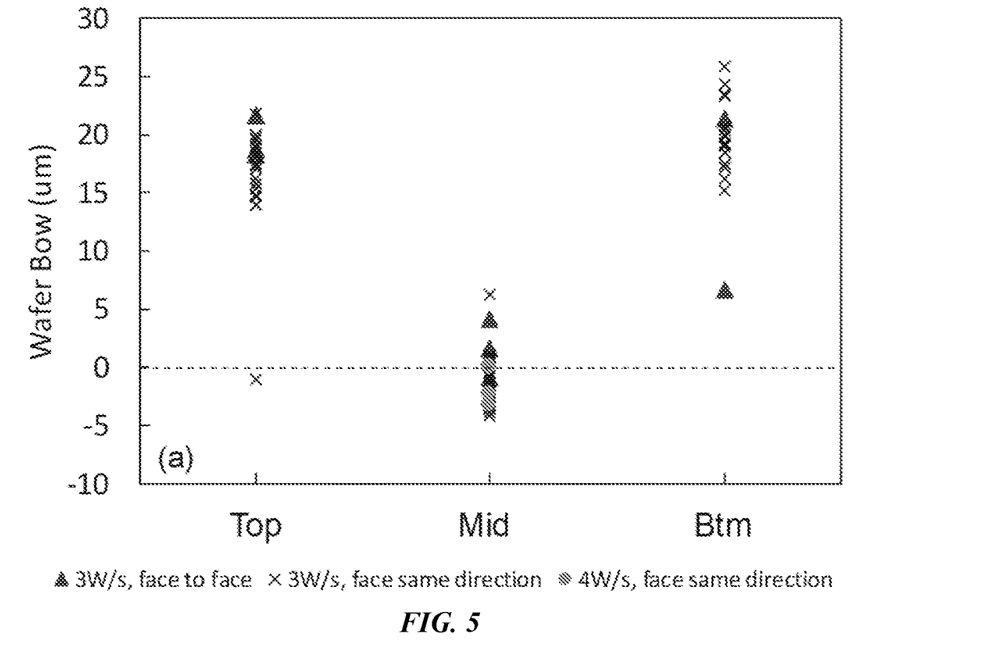
FIG. 5 shows a chart of wafer bow of substrates with films produced according to some embodiments of the present technology.

Additionally, orientation of the substrates may impact film stress effects caused by the duration at high temperature. For example, when a substrate is maintained as neither the top nor bottom substrate, the film stress may be less affected by the anneal compared to a top or bottom substrate. Substrates on which an aluminum nitride film has been formed may be characterized by a certain amount of bowing due to the internal stress characteristics of the film. When a number of substrates are stacked as illustrated, exterior substrates, such as the first and last or top and bottom substrates, may be characterized by further increased substrate bow, which may increase by greater than or about 10 µm, and may increase by greater than or about 15 µm, greater than or about 20 µm, greater than or about 25 µm, or more. This may lead to film pealing, or greater losses on the substrate. However, interior substrates may be characterized by an increased bow of less than or about 10 µm, and may be characterized by an increased bow of less than or about 5 µm, less than or about 3 µm, less than or about 1 µm, or less, including no increase in wafer bow at all, as well as a reduction of wafer bow of greater than or about 1 µm, greater than or about 3 µm, greater than or about 5 µm, or more. For example, as illustrated in FIG. 5, wafers located in the middle of a stack of wafers are characterized by limited or substantially no bow regardless of orientation in some embodiments.

Accordingly, in some embodiments, processing operations may include utilizing one or more cover wafers during the positioning of substrates in the carrier. Cover wafers may be formed of any material that may withstand the anneal environment, although in some embodiments cover wafers may include similar films as interior substrates to be annealed. By including a similar substrate, such as sapphire, with a similar material layer, such as physical-vapor deposited aluminum nitride, the cover wafers may be characterized by a similar wafer bow as the other substrates to be processed, which may improve the effects of the anneal on the interior wafers. For example, a first cover wafer may be seated on the ledge 410 of the carrier, with one or more substrates to be annealed seated overlying the first cover wafer. Although two such substrates are illustrated, in embodiments encompassed by the present technology greater than or about 1 substrate, greater than or about 2 substrates, greater than or about 3 substrates, greater than or about 4 substrates, greater than or about 5 substrates, greater than or about 6 substrates, greater than or about 7 substrates, greater than or about 8 substrates, greater than or about 9 substrates, greater than or about 10 substrates, or more substrates may be stacked overlying the first cover wafer.

A second cover wafer may then be positioned overlying the one or more interior substrates of the stack. Consequently, the processed substrates may not be seated directly on the carrier, and may only have contact at discreet locations, such as a point contact against an outer rail of the carrier, for example. In some embodiments, the interior substrates of the stack may have little or no contact with the carrier. Additionally, in some embodiments, the cover wafers may be characterized by a larger diameter than the substrates to be processed, which may further ensure the substrates are not in contact or are in limited contact with the carrier to reduce any temperature effects across the substrates.

As shown, the substrates may be positioned in direct contact with one another, and in some embodiments the buffer layer, formed on a first surface of the substrate, may be positioned in contact with a second surface of the substrate opposite the first, such as a backside of the substrate, of an adjacent substrate or cover wafer being processed. The substrates may be oriented in all the same direction, and in some embodiments all substrates and cover wafers may be positioned face down within the carrier in a stack. By positioning the substrates face down, the stress imposed by the film may be at least partially counteracted by the orientation, which may further facilitate reductions or limits on increasing the film stress or wafer bow during the anneal process. Accordingly, interior substrates, or any substrates, processed according to embodiments of the present technology may be characterized by increased coverage as noted above by limiting exposure of the films during the anneal, which may limit evaporation or other losses.

Figure 6A:
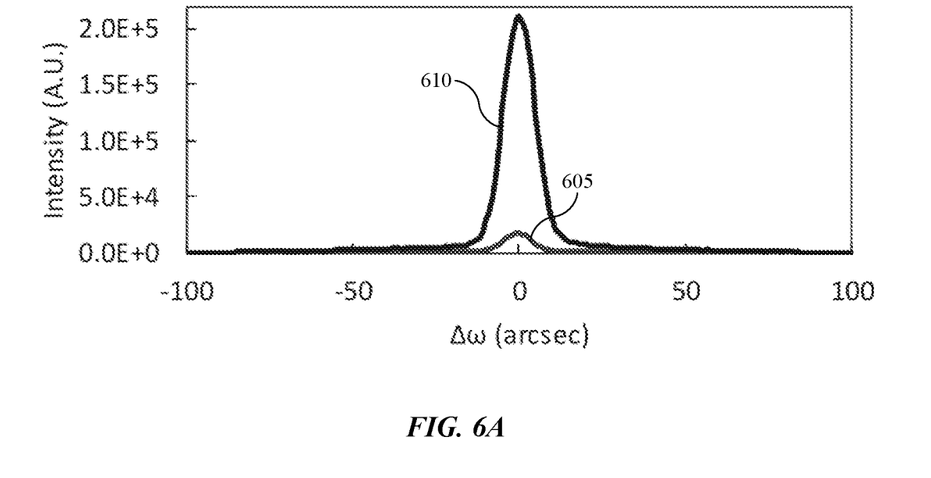
FIGS. 6A-6B show charts of rocking curve scans of films produced according to some embodiments of the present technology.
Figure 6B:
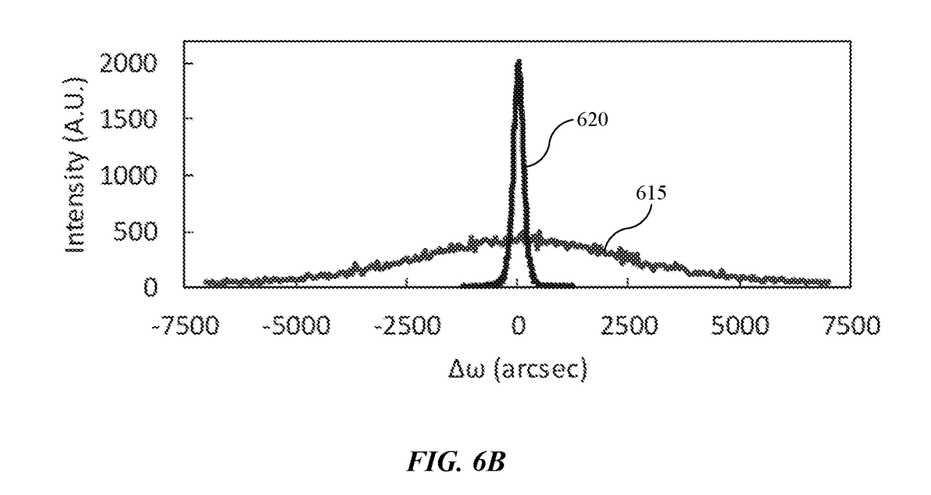

X-ray diffraction of substrates tested showed that by annealing substrates or buffer films for a sufficient time at a sufficient temperature, and while orienting the substrates in certain configurations, for example, the film quality may increase and consistency may improve across the substrate. For example, an x-ray diffraction rocking curve produced from the buffer layer having an average aluminum nitride thickness of up to 300 nm may produce a full width at half maximum measurement along the (102) crystal direction of less than or about 300 arcseconds, and may produce a full width at half maximum along the (102) crystal direction of less than or about 290 arcseconds, less than or about 280 arcseconds, less than or about 270 arcseconds, less than or about 260 arcseconds, less than or about 250 arcseconds, less than or about 240 arcseconds, less than or about 230 arcseconds, less than or about 220 arcseconds, or less. For example, FIGS. 6A-6B illustrate x-ray diffraction rocking curves of aluminum nitride. FIG. 6A illustrates a curve along the (002) crystal direction and shows the intensity change between the curve before anneal with line 605 and after anneal with curve 610. Similarly, FIG. 6B illustrates a curve along the (102) crystal direction and shows the intensity change between the curve before anneal with line 615 and after anneal with curve 620. These measurements may be consistent across both the x-direction, which may be parallel to the wafer flat, and in the y-direction, which may be perpendicular to the wafer flat. By utilizing processes and materials according to embodiments of the present technology, high-quality buffer layers characterized by reduced threading dislocations and increased surface coverage may be produced. This may reduce the time to produce LED structures overlying the buffer layer, and may produce LEDs characterized by improved operational efficiency over conventionally produced devices.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either limit of the range, both limits of the range, or neither limit of the range are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the LED" includes reference to one or more LEDs and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming an LED structure, the method comprising:
    depositing an aluminum nitride layer on a substrate via a physical vapor deposition process;
    transferring the substrate to a carrier subsequent to depositing the aluminum nitride layer, wherein a first cover wafer is disposed overlying the substrate on the carrier, a second cover wafer is disposed underlying the substrate on the carrier, and each of the first cover wafer and the second cover wafer comprises a substrate having an aluminum nitride layer;
    heating the aluminum nitride layer to a temperature greater than or about 1500° C.; and
    forming an ultraviolet light emitting diode ("LED") structure overlying the aluminum nitride layer utilizing a metal-organic chemical vapor deposition or molecular beam epitaxy.

2. The method of forming an LED structure of claim 1, wherein the carrier comprises carbon, and wherein the carrier defines a ledge on which the substrate is seated.

3. The method of forming an LED structure of claim 1, wherein the first cover wafer and the second cover wafer are oriented in a similar direction as the substrate.

4. The method of forming an LED structure of claim 1, wherein the substrate is disposed face down on the carrier.

5. The method of forming an LED structure of claim 1, wherein at least two substrates are disposed in direct contact between the first cover wafer and the second cover wafer on the carrier.

6. The method of forming an LED structure of claim 1, wherein the aluminum nitride layer is heated to a temperature between about 1600° C. and about 1800° C.

7. The method of forming an LED structure of claim 1, wherein the aluminum nitride layer is heated at greater than or about 1000° C. for at least 100 minutes.

8. The method of forming an LED structure of claim 1, wherein a full width at half maximum of an x-ray diffraction rocking curve of the aluminum nitride layer along the (102) crystal direction is less than or about 300 arc-seconds.

9. The method of forming an LED structure of claim 1, wherein the substrate maintains greater than or about 85% coverage of the aluminum nitride layer subsequent to heating the aluminum nitride layer.

10. A method of forming an LED structure, the method comprising:
    depositing an aluminum nitride layer on a first substrate and a second substrate via a physical vapor deposition process;
    forming an ultraviolet light emitting diode structure overlying the aluminum nitride layer;
    positioning the first substrate face down in a carrier on a first cover wafer;
    positioning the second substrate face down in contact with the first substrate;
    positioning a second cover wafer overlying the second substrate on the carrier; and
    heating the first substrate and the second substrate to a temperature greater than or about 1500° C.

11. The method of forming an LED structure of claim 10, further comprising:
    forming the ultraviolet light emitting diode structure overlying the aluminum nitride layer utilizing a metal-organic chemical vapor deposition or molecular beam epitaxy.

12. The method of forming an LED structure of claim 10, wherein the aluminum nitride layer is heated to a temperature between about 1600° C. and about 1800° C.

13. The method of forming an LED structure of claim 10, wherein the carrier comprises carbon, and wherein the carrier defines a ledge on which both of the first substrate and the second substrate are seated.

14. The method of forming an LED structure of claim 10, wherein each of the first cover wafer and the second cover wafer comprises a substrate having an aluminum nitride layer.

15. The method of forming an LED structure of claim 14, wherein each of the first cover wafer, the second cover wafer, the first substrate, and the second substrate is oriented in a similar direction.

16. A method of forming an LED structure, the method comprising:
    depositing an aluminum nitride layer on a substrate via a physical vapor deposition process;
    positioning the substrate face down overlying a first cover wafer positioned in a earner;
    positioning a second cover wafer overlying the substrate;
    heating the aluminum nitride layer to a temperature greater than or about 1500° C.; and
    forming an ultraviolet light emitting diode ("LED") structure overlying the aluminum nitride layer utilizing a metal-organic chemical vapor deposition or molecular beam epitaxy.

17. The method of forming an LED structure of claim 16, wherein a full width at half maximum of an x-ray diffraction rocking curve of the aluminum nitride layer along the (102) crystal direction is less than or about 300 arc-seconds.

* * * * *